(12) United States Patent
Murata

(10) Patent No.: US 10,784,828 B2
(45) Date of Patent: Sep. 22, 2020

(54) METHODS AND APPARATUS FOR AN OPERATIONAL AMPLIFIER WITH A VARIABLE GAIN-BANDWIDTH PRODUCT

(71) Applicant: SEMICONDUCTOR COMPONENTS INDUSTRIES, LLC, Phoenix, AZ (US)

(72) Inventor: Tsutomu Murata, Mizuho (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 40 days.

(21) Appl. No.: 16/233,377

(22) Filed: Dec. 27, 2018

(65) Prior Publication Data

US 2020/0212857 A1    Jul. 2, 2020

(51) Int. Cl.
*H03F 1/02* (2006.01)
*H03F 3/45* (2006.01)

(52) U.S. Cl.
CPC ..... *H03F 3/45179* (2013.01); *H03F 3/45632* (2013.01); *H03F 2203/45134* (2013.01)

(58) Field of Classification Search
CPC ........ H03F 3/005; H03F 3/45; H03F 2200/06; H03F 2200/09
USPC ...................... 330/9, 69, 305, 301
See application file for complete search history.

(56) References Cited

U.S. PATENT DOCUMENTS

| | | | | |
|---|---|---|---|---|
| 4,714,895 A | * | 12/1987 | Nicollini | H03F 3/45179 330/253 |
| 5,838,200 A | * | 11/1998 | Opris | H03F 3/45188 330/258 |
| 6,002,299 A | * | 12/1999 | Thomsen | H03F 1/083 330/107 |
| 2006/0244521 A1 | | 11/2006 | Yoshida | |
| 2012/0013351 A1 | | 1/2012 | Daniel | |

* cited by examiner

*Primary Examiner* — Steven J Mottola
(74) *Attorney, Agent, or Firm* — The Noblitt Group, PLLC; Hettie L. Haines

(57) ABSTRACT

Various embodiments of the present technology comprise a method and apparatus for an operational amplifier with a variable gain-bandwidth product. According to various embodiments, an amplifier circuit comprising the operational amplifier operates in multiple stages and provides a low gain-bandwidth and a high gain-bandwidth.

16 Claims, 13 Drawing Sheets

_METHODS AND APPARATUS FOR AN OPERATIONAL AMPLIFIER WITH A VARIABLE GAIN-BANDWIDTH PRODUCT_

BACKGROUND OF THE TECHNOLOGY

Many electrical systems utilize multiple operational amplifiers to perform different amplifying stages. However, a single, fully-differential amplifier that operates in multiple stages to provide a desired output signal may be impacted by a load from a previous stage. For example, if the load on a second stage is larger than the load on a first stage, then the operating frequency of the operational amplifier must be increased during the second stage. When the operational amplifier returns back to the first stage, increased thermal noise may be observed as a result of the higher operating frequency during the first stage. In general, thermal noise has a negative impact on the signal, resulting in a signal with less desirable signal-to-noise characteristics.

SUMMARY OF THE INVENTION

Various embodiments of the present technology comprise a method and apparatus for an operational amplifier with a variable gain-bandwidth product. According to various embodiments, an amplifier circuit comprising the operational amplifier operates in multiple stages and provides a low gain-bandwidth and a high gain-bandwidth.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various sensors, analog-to-digital converters, switch elements, logic circuits, signal generators, and the like, which may carry out a variety of functions. In addition, the present technology may be practiced in conjunction with any number of electronic systems, such as sensor systems or any other systems that require a fully-differential mode and a single-ended mode and/or an operational amplifier with a variable gain-bandwidth, and the systems described are merely exemplary applications for the technology.

Figure 1:
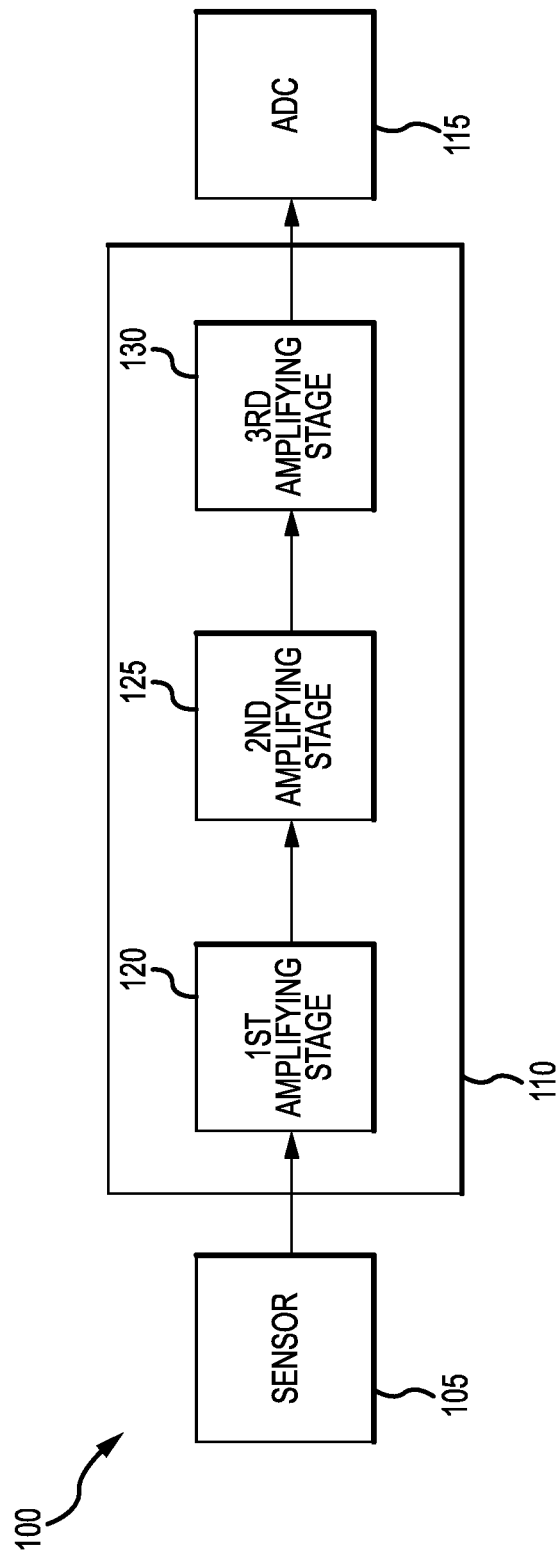
FIG. 1 is a block diagram of a sensor system comprising a multi-stage amplifier circuit in accordance with an exemplary embodiment of the present technology.

Methods and apparatus for an operational amplifier with a variable gain-bandwidth product according to various aspects of the present technology may operate in conjunction with any suitable sensor, such as an image sensor or a gyro sensor, and any suitable analog-to-digital converter. Referring to FIG. 1, an exemplary sensor system 100 may comprise a sensor circuit 105, an amplifier circuit 110, and an analog-to-digital converter (ADC) 115 that operate together to amplify sensor signals and convert analog sensor signals into digital signals.

The sensor circuit 105 may generate various sensor signals. In some cases, it may be desired to amplify the sensor signals prior to processing the signals. For example, the sensor circuit 105 may comprise an image sensor for generating pixel signals.

The amplifier circuit 110 may be configured to receive and amplify the sensor signals. According to an exemplary embodiment, and referring to FIG. 2 the amplifier circuit 110 may comprise a plurality of switches, such as switches SW1A:SW12A and switches SW1B:SW12B, an operational amplifier (op-amp) 200, and a switching circuit 205.

According to various embodiments, the op-amp 200 may be configured as both a single-ended op-amp and a fully-differential op-amp. Accordingly, the op-amp 200 is capable of operating in both the single-ended mode and the fully-differential mode. For example, the op-amp 200 may be configured to receive and respond to a mode signal, such as a high mode signal 'H' (i.e., a high voltage) and a low mode signal 'L' (i.e., a low voltage).

Figure 11:
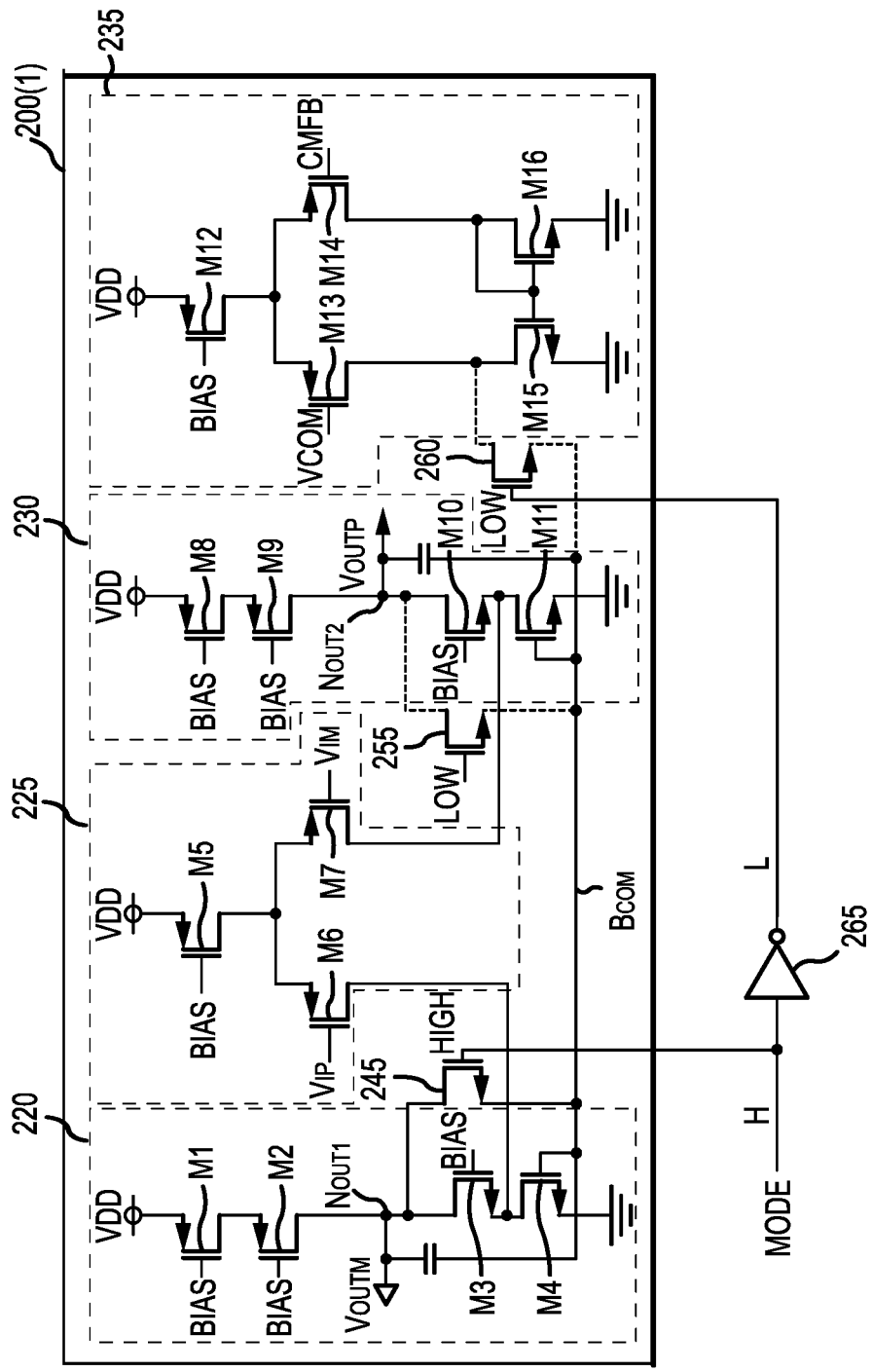
FIG. 11 is a circuit diagram of a first embodiment of an operational amplifier in accordance with the present technology.

Referring to FIG. 11, in a first embodiment, the op-amp 200(1) may comprise a plurality of sub-circuits, such as a first sub-circuit 220, a second sub-circuit 225, a third sub-circuit 230, and a fourth sub-circuit 235, that are connected together and configured to amplify an input signal, such as a first input signal $V_{IM}$ and a second input signal $V_{IP}$.

The first, third, and fourth sub-circuits 220, 230, 235 may be directly connected to each other via a bias node $B_{COM}$ and the second sub-circuit 225 may be connected directly to the first and third sub-circuits 220, 230. The op-amp 200(1) may further comprise a plurality of mode switch elements, such as a first mode switch 245 and a second mode switch 260, that are selectively enabled/disabled to operate the op-amp 200(1) in one of the fully-differential mode or the single-ended mode at any given time.

The first sub-circuit 220 may comprise a first plurality of transistors, such as a first transistor M1, a second transistor M2, a third transistor M3, and a fourth transistor M4. The first and second transistors M1, M2 may be connected in series. The first and second transistors M1, M2 may comprise p-channel transistors. A source terminal of the first transistor M1 may be connected to a supply voltage VDD and a drain terminal of the second transistor M2 may be connected to a first output node $N_{OUT1}$. Gate terminals of each of the first and second transistors M1, M2 may be connected to a bias voltage.

The third and fourth transistors M3, M4 may be connected in series. The third and fourth transistors M3, M4 may comprise n-channel transistors. A drain terminal of the third transistor M3 may be connected to the first output node $N_{OUT1}$ and a source terminal of the fourth transistor M4 may be connected to a reference voltage, such as a ground. A gate terminal of the third transistor M3 may be connected to a bias voltage and a gate terminal of the fourth transistor may be connected to the bias node $B_{COM}$. The first output node $N_{OUT1}$ may also serve as a first output terminal for a first output voltage $V_{OUTM}$.

The first mode switch 245 may comprise a transistor, such as an n-channel transistor. A drain terminal of the first mode switch 245 may be connected to the first output node $N_{OUT1}$, a source terminal of the first mode switch 245 may be connected to the bias node $B_{COM}$, and a gate terminal of the first mode switch 245 may be configured to receive the mode signal.

The second sub-circuit 225 may comprise a second plurality of transistors, such as a fifth transistor M5, a sixth transistor M6, and a seventh transistor M7. The fifth transistor M5 may comprise a p-channel transistor comprising a source terminal connected to the supply voltage VDD and a drain terminal connected to the sixth and seventh transistors M6, M7. A gate terminal of the fifth transistor M5 may be connected to a bias voltage.

The sixth and seventh transistor M6, M7 may be connected in parallel with each other and in series with the fifth transistor M5. The sixth and seventh transistors M6, M7 may comprise p-channel transistors. Accordingly, source terminals of the sixth and seventh transistors M6, M7 may each be connected to the drain terminal of the fifth transistor M5. A gate terminal of the sixth transistor M6 may be connected to the first input voltage $V_{IP}$ and a gate terminal of the seventh transistor M7 may be connected to the second input voltage $V_{IM}$. A drain terminal of the sixth transistor M6 may be directly connected to the first sub-circuit 220, for example to the source terminal of the third transistor M3 and the drain terminal of the fourth transistor M4. A drain terminal of the seventh transistor M7 may be directly connected to the third sub-circuit 230.

The third sub-circuit 230 may comprise a third plurality of transistors, such as an eighth transistor M8, a ninth transistor M9, a tenth transistor M10, and an eleventh transistor M11. The eighth and ninth transistors M8, M9 may be connected in series. The eighth and ninth transistors M8, M9 may comprise p-channel transistors. A source terminal of the eighth transistor M8 may be connected to the supply voltage VDD and a drain terminal of the ninth transistor M9 may be connected to a second output node $N_{OUT2}$. Gate terminals of each of the eighth and ninth transistors M8, M9 may be connected to a bias voltage.

The tenth and eleventh transistors M10, M11 may be connected in series. The tenth and eleventh transistors M10, M11 may comprise n-channel transistors. A drain terminal of the tenth transistor M10 may be connected to the second output node $N_{OUT2}$ and a source terminal of the eleventh transistor M11 may be connected to a reference voltage, such as the ground. A gate terminal of the tenth transistor M10 may be connected to a bias voltage and a gate terminal of the eleventh transistor M11 may be connected to the bias node $B_{COM}$. The second output node $N_{OUT2}$ may also serve as a second output terminal for a second output voltage $V_{OUTP}$.

The op-amp 200(1) may further comprise a dummy switch 255 to improve the accuracy of an output of the op-amp 200(1). The dummy switch 255 may comprise a transistor, such as an n-channel transistor. According to the present embodiment, the dummy switch 255 is always set to OFF (open) for all operations.

The fourth sub-circuit 235 may comprise a fourth plurality of transistors, such as a twelfth transistor M12, a thirteenth transistor M13, and a fourteenth transistor M14. The twelfth transistor M12 may comprise a p-channel transistor comprising a source terminal connected to the supply voltage VDD and a drain terminal connected to the thirteenth and fourteenth transistors M13, M14. A gate terminal of the twelfth transistor M12 may be connected to a bias voltage.

The thirteenth and fourteenth transistors M13, M14 may be connected in parallel with each other and in series with the twelfth transistor M12. The thirteenth and fourteenth transistors M13, M14 may comprise p-channel transistors. Accordingly, source terminals of the thirteenth and fourteenth transistors M13, M14 may each be connected to the drain terminal of the twelfth transistor M12. A gate terminal of the thirteenth transistor M13 may be connected to a common voltage VCOM and a gate terminal of the fourteenth transistor M14 may be connected to a common mode feedback signal CMFB.

The fourth sub-circuit 235 may further comprise a fifteenth transistor M15 and a sixteenth transistor M16 arranged as a current mirror and connected to the thirteenth and fourteenth transistors M13, M14. The fifteenth and sixteenth transistors M15, M16 may comprise n-channel transistors. Accordingly, a drain terminal of the fifteenth transistor M15 may be connected to a drain terminal of the thirteenth transistor M13 and a drain terminal of the sixteenth transistor M16 may be connected to the a drain terminal of the fourteenth transistor M14. The drain terminal of the sixteenth transistor M16 may also be connected to a gate terminal of the fifteenth transistor M15 and a gate terminal of the sixteenth transistor M16.

The second mode switch 260 may comprise a transistor, such as an n-channel transistor. A drain terminal of the second mode switch 260 may be connected to the fourth sub-circuit 235, a source terminal of the second mode switch 260 may be connected to the bias node $B_{COM}$, and a gate terminal of the second mode switch 260 may be configured to receive the mode signal.

Figure 12:
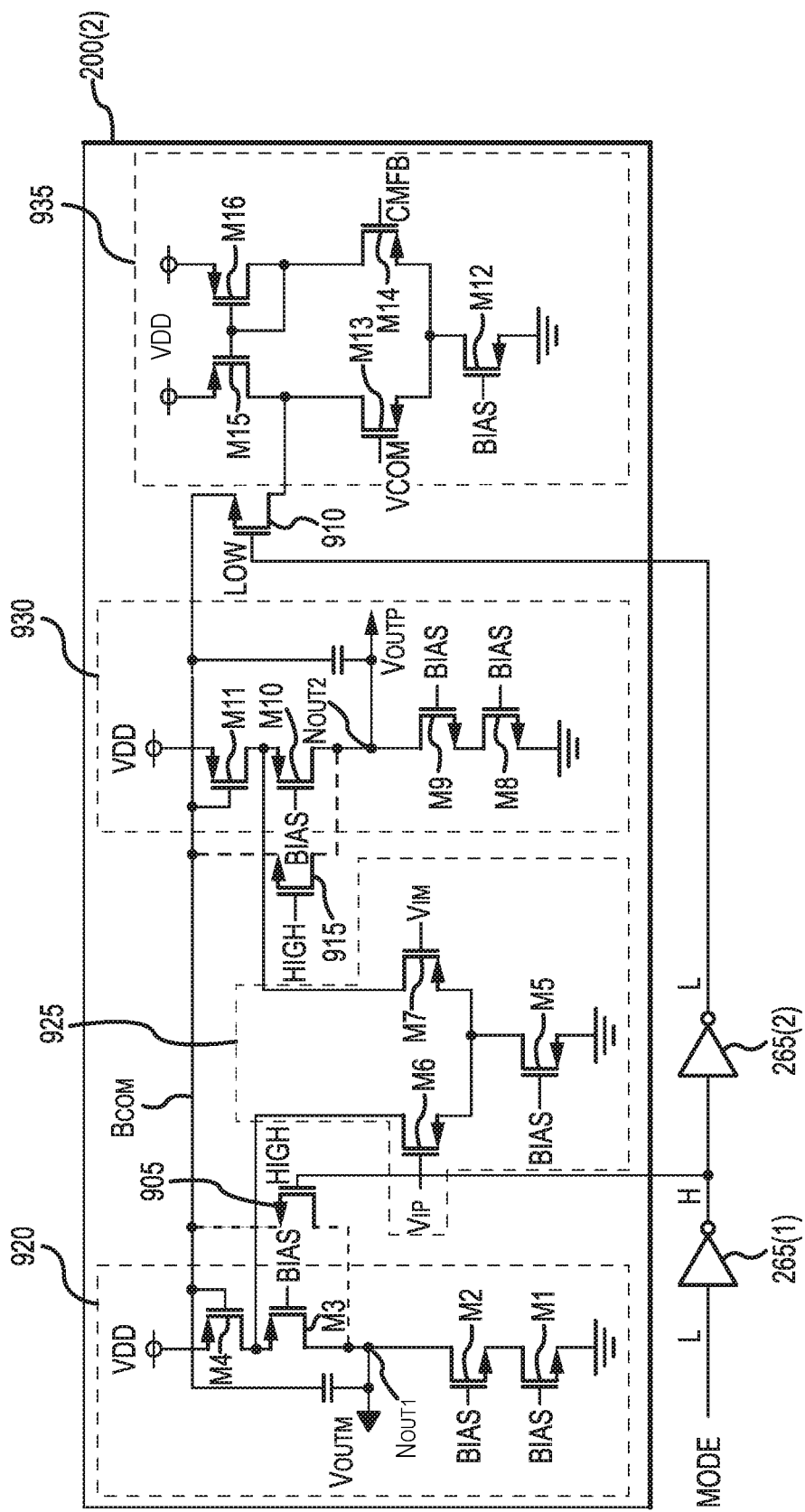
FIG. 12 is a circuit diagram of a second embodiment of an operational amplifier in accordance with the present technology.

Referring to FIG. 12, in a second embodiment, the op-amp 200(2) may be configured to operate in both a fully-differential mode and a single-ended mode. For example, the op-amp 200(2) may be configured to receive and respond to a mode signal, such as a high mode signal 'H' (i.e., a high voltage) and a low mode signal 'L' (i.e., a low voltage). According to the present embodiment, the op-amp 200(2) may comprise a plurality of sub-circuits, such as a first sub-circuit 920, a second sub-circuit 925, a third sub-circuit 930, and a fourth sub-circuit 935, that are connected together and configured to amplify an input signal, such as a first input signal $V_{IP}$ and a second input signal $V_{IM}$. For example, the first, third, and fourth sub-circuits 920, 930, 935 may be directly connected to each other via a bias node $B_{COM}$ and the second sub-circuit 925 may be connected directly to the first and third sub-circuits 920, 930. The op-amp 200(2) may further comprise a plurality of mode switch elements, such as a first mode switch 905 and a second mode switch 910, that are selectively enabled/disabled to operate the op-amp 200(2) in one of the fully-differential mode or the single-ended mode at any given time.

The first sub-circuit 920 may comprise a first plurality of transistors, such as a first transistor M1, a second transistor M2, a third transistor M3, and a fourth transistor M4. The first and second transistors M1, M2 may be connected in series. The first and second transistors M1, M2 may comprise n-channel transistors. A source terminal of the first transistor M1 may be connected to a reference voltage, such as a ground, and a drain terminal of the second transistor M2 may be connected to a first output node $N_{OUT1}$. Gate terminals of each of the first and second transistors M1, M2 may be connected to a bias voltage.

The third and fourth transistors M3, M4 may be connected in series. The third and fourth transistors M3, M4 may comprise p-channel transistors. A drain terminal of the third transistor M3 may be connected to the first output node $N_{OUT1}$ and a source terminal of the fourth transistor M4 may be connected to a supply voltage VDD. A gate terminal of the third transistor M3 may be connected to a bias voltage and a gate terminal of the fourth transistor may be connected to the bias node $B_{COM}$. The first output node $N_{OUT1}$ may also serve as a first output terminal for a first output voltage $V_{OUTM}$.

The first mode switch 905 may comprise a transistor, such as a p-channel transistor. A source terminal of the first mode switch 905 may be connected to the bias node $B_{COM}$, a drain terminal of the first mode switch 905 may be connected to the first output node $N_{OUT1}$, and a gate terminal of the first mode switch 905 may be configured to receive the mode signal.

The second sub-circuit 925 may comprise a second plurality of transistors, such as a fifth transistor M5, a sixth transistor M6, and a seventh transistor M7. The fifth transistor M5 may comprise an n-channel transistor with a source terminal connected to the reference voltage and a drain terminal connected to the sixth and seventh transistors M6, M7. A gate terminal of the fifth transistor may be connected to a bias voltage.

The sixth and seventh transistor M6, M7 may be connected in parallel with each other and in series with the fifth transistor M5. The sixth and seventh transistors M6, M7 may comprise n-channel transistors. Accordingly, source terminals of the sixth and seventh transistors M6, M7 may each be connected to the drain terminal of the fifth transistor M5. A gate terminal of the sixth transistor M6 may be connected to the first input voltage $V_{IP}$ and a gate terminal of the seventh transistor M7 may be connected to the second input voltage $V_{IM}$. A drain terminal of the sixth transistor M6 may be directly connected to the first sub-circuit 920, for example to the source terminal of the third transistor M3 and the drain terminal of the fourth transistor M4. A drain terminal of the seventh transistor M7 may be directly connected to the third sub-circuit 930.

The third sub-circuit 930 may comprise a third plurality of transistors, such as an eighth transistor M8, a ninth transistor M9, a tenth transistor M10, and an eleventh transistor M11. The eighth and ninth transistors M8, M9 may be connected in series. The eighth and ninth transistors M8, M9 may comprise n-channel transistors. A source terminal of the eighth transistor M8 may be connected to the reference voltage and a drain terminal of the ninth transistor M9 may be connected to a second output node $N_{OUT2}$. Gate terminals of each of the eighth and ninth transistors M8, M9 may be connected to a bias voltage.

The tenth and eleventh transistors M10, M11 may be connected in series. The tenth and eleventh transistors M10, M11 may comprise p-channel transistors. A drain terminal of the tenth transistor M10 may be connected to the second output node $N_{OUT2}$ and a source terminal of the eleventh transistor M11 may be connected to the supply voltage VDD. A gate terminal of the tenth transistor M10 may be connected to a bias voltage and a gate terminal of the eleventh transistor M11 may be connected to the bias node $B_{COM}$. The second output node $N_{OUT2}$ may also serve as a second output terminal for a second output voltage $V_{OUTP}$.

The op-amp 200(2) may further comprise a dummy switch 915 to improve the accuracy of an output of the op-amp 200(2). The dummy switch 915 may comprise a transistor, such as a p-channel transistor. According to the present embodiment, the dummy switch 915 is always set to OFF (open) for all operations.

The fourth sub-circuit 935 may comprise a fourth plurality of transistors, such as a twelfth transistor M12, a thirteenth transistor M13, and a fourteenth transistor M14. The twelfth transistor M12 may comprise an n-channel transistor with a source terminal connected to the reference voltage and a drain terminal connected to the thirteenth and fourteenth transistors M13, M14. A gate terminal of the twelfth transistor M12 may be connected to a bias voltage.

The thirteenth and fourteenth transistors M13, M14 may be connected in parallel with each other and in series with the twelfth transistor M12. The thirteenth and fourteenth transistors M13, M14 may comprise n-channel transistors. Accordingly, source terminals of the thirteenth and fourteenth transistors M13, M14 may each be connected to the drain terminal of the twelfth transistor M12. A gate terminal of the thirteenth transistor M13 may be connected to a common voltage VCOM and a gate terminal of the fourteenth transistor M14 may be connected to a common mode feedback signal CMFB.

The fourth sub-circuit 1035 may further comprise a fifteenth transistor M15 and a sixteenth transistor M16 arranged as a current mirror and connected to the thirteenth and fourteenth transistors M13, M14. The fifteenth and sixteenth transistors M15, M16 may comprise p-channel transistors. Accordingly, a drain terminal of the fifteenth transistor M15 may be connected to a drain terminal of the thirteenth transistor M13 and a drain terminal of the sixteenth transistor M16 may be connected to the a drain terminal of the fourteenth transistor M14. The drain terminal of the sixteenth transistor M16 may also be connected to a gate terminal of the fifteenth transistor M15 and a gate terminal of the sixteenth transistor M16.

The second mode switch 910 may comprise a transistor, such as a p-channel transistor. A drain terminal of the second mode switch 910 may be connected to the fourth sub-circuit 935, a source terminal of the second mode switch 910 may be connected to the bias node $B_{COM}$, and a gate terminal of the second mode switch 910 may be configured to receive the mode signal.

Figure 13:
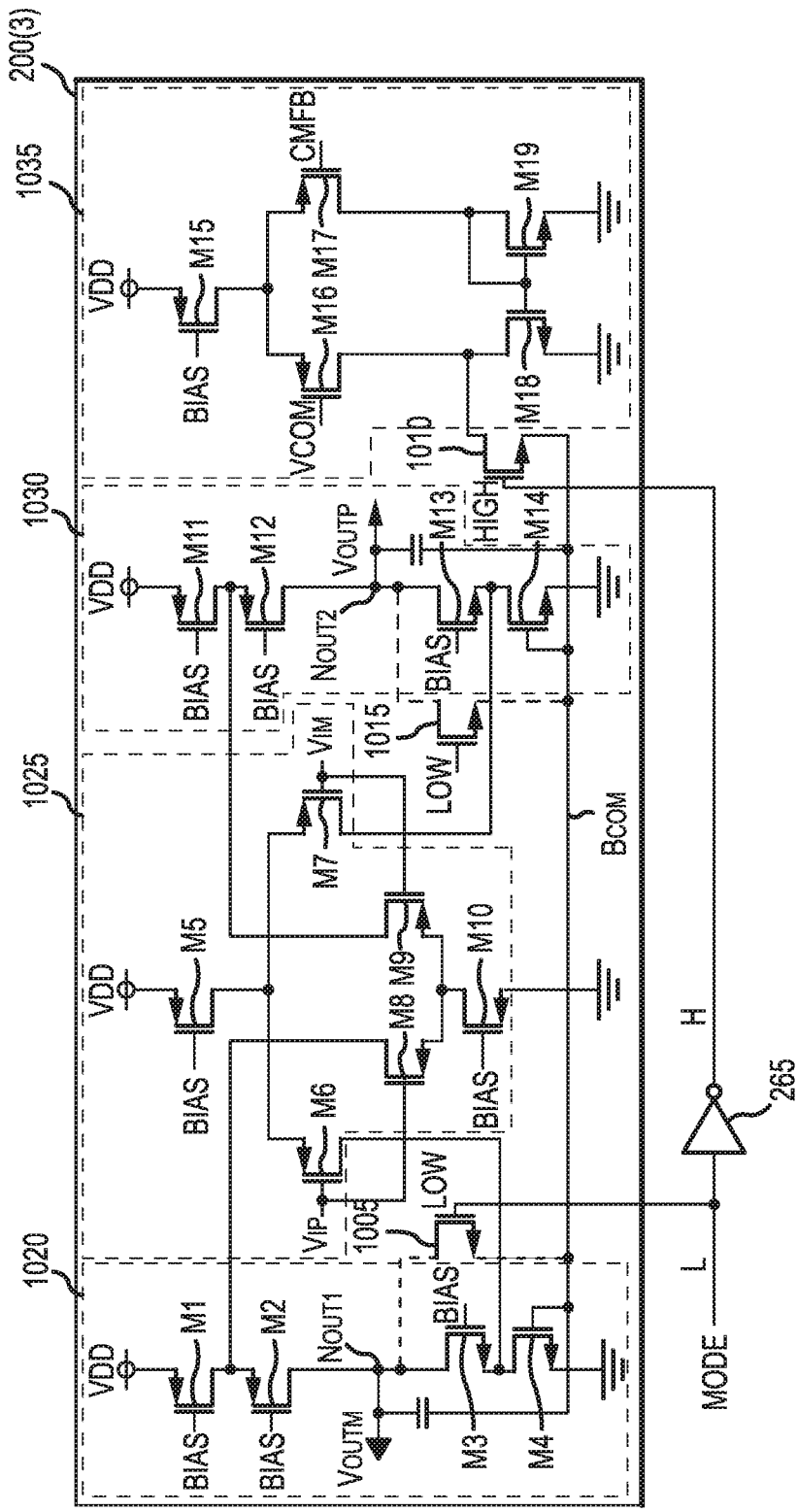
FIG. 13 is a circuit diagram of a third embodiment of an operational amplifier in accordance with the present technology.

Referring to FIG. 13, in a third embodiment, the op-amp 200(3), may be configured to operate in both a fully-differential mode and a single-ended mode. For example, the op-amp 200(3) may be configured to receive and respond to a mode signal, such as a high mode signal 'H' (i.e., a high voltage) and a low mode signal 'L' (i.e., a low voltage). According to the present embodiment, the op-amp 200(3) may comprise a plurality of sub-circuits, such as a first sub-circuit 1020, a second sub-circuit 1025, a third sub-circuit 1030, and a fourth sub-circuit 1035, which are connected together and configured to amplify an input signal, such as a first input signal VIP and a second input signal VIM. For example, the first, third, and fourth sub-circuits 1020, 1030, 1035 may be directly connected to each other via a bias node $B_{COM}$ and the second sub-circuit 1025 may be connected directly to the first and third sub-circuits 1020, 1030. The op-amp 200(3) may further comprise a plurality of mode switch elements, such as a first mode switch 1005 and a second mode switch 1010, that are selectively enabled/disabled to operate the op-amp 200(3) in one of the fully-differential mode or the single-ended mode at any given time.

The first sub-circuit 1020 may comprise a first plurality of transistors, such as a first transistor M1, a second transistor M2, a third transistor M3, and a fourth transistor M4. The first and second transistors M1, M2 may be connected in series. The first and second transistors M1, M2 may comprise p-channel transistors. A source terminal of the first transistor M1 may be connected to a supply voltage VDD and a drain terminal of the second transistor M2 may be connected to a first output node $N_{OUT1}$. Gate terminals of each of the first and second transistors M1, M2 may be connected to a bias voltage.

The third and fourth transistors M3, M4 may be connected in series. The third and fourth transistors M3, M4 may comprise n-channel transistors. A drain terminal of the third transistor M3 may be connected to the first output node $N_{OUT1}$ and a source terminal of the fourth transistor M4 may be connected to a reference voltage, such as a ground. A gate terminal of the third transistor M3 may be connected to a bias voltage and a gate terminal of the fourth transistor M4 may be connected to the bias node $B_{COM}$. The first output node $N_{OUT1}$ may also serve as a first output terminal for a first output voltage $V_{OUTM}$.

The first mode switch 1005 may comprise a transistor, such as an n-channel transistor. A drain terminal of the first mode switch 1005 may be connected to the first output node $N_{OUT1}$, a source terminal of the first mode switch 1005 may be connected to the bias node $B_{COM}$, and a gate terminal of the first mode switch 1005 may be configured to receive the mode signal.

The second sub-circuit 1025 may comprise a plurality of transistors, such as a fifth transistor M5, a sixth transistor M6, and a seventh transistor M7. The fifth transistor M5 may comprise a p-channel transistor comprising a source terminal connected to the supply voltage VDD and a drain terminal connected to the sixth and seventh transistors M6, M7. A gate terminal of the fifth transistor M5 may be connected to a bias voltage.

The sixth and seventh transistors M6, M7 may be connected in parallel with each other and in series with the fifth transistor M5. The sixth and seventh transistors M6, M7 may comprise p-channel transistors. Accordingly, source terminals of the sixth and seventh transistors M6, M7 may each be connected to the drain terminal of the fifth transistor M5. A gate terminal of the sixth transistor M6 may be connected to the first input voltage $V_{IP}$ and a gate terminal of the seventh transistor M7 may be connected to the second input voltage $V_{IM}$. A source terminal of the sixth transistor M6 may be directly connected to the first sub-circuit 1020, for example to the source terminal of the third transistor M3 and the drain terminal of the fourth transistor M4. A drain terminal of the seventh transistor M7 may be directly connected to the third sub-circuit 1030.

The second sub-circuit 1025 may further comprise an eight transistor M8, a ninth transistor M9, and a tenth transistor M10, wherein M8, M9 and M10 comprise n-channel transistors. A gate terminal of the eight transistor M8 is connected to the first input voltage $V_{IP}$ and a drain terminal is connected to the first sub-circuit 1020, for example between the first and second transistors M1, M2. A gate terminal of the ninth transistor M9 is connected to the second input voltage $V_{IM}$ and a drain terminal is connected to the third sub-circuit 1030. Source terminals of the eighth and ninth transistors M8, M9 are connected to a drain terminal of tenth transistor M10. A source terminal of the tenth transistor M10 may be connected to the reference voltage.

The third sub-circuit 1030 may comprise a third plurality of transistors, such as an eleventh transistor M11, a twelfth transistor M12, a thirteenth transistor M13, and a fourteenth transistor M14. The eleventh and twelfth transistors M11, M12 may be connected in series. The eleventh and twelfth transistors M11, M12 may comprise p-channel transistors. A source terminal of the eleventh transistor M11 may be connected to the supply voltage VDD and a drain terminal of the twelfth transistor M12 may be connected to a second output node $N_{OUT2}$. Gate terminals of each of the eleventh and twelfth transistors M11, M12 may be connected to a bias voltage.

The thirteenth and fourteenth transistors M13, M14 may be connected in series. The thirteenth and fourteenth transistors M13, M14 may comprise n-channel transistors. A drain terminal of the thirteenth transistor M13 may be connected to the second output node $N_{OUT2}$ and a source terminal of the fourteenth transistor M14 may be connected to a reference voltage, such as the ground. A gate terminal of the thirteenth transistor M13 may be connected to a bias voltage and a gate terminal of the fourteenth transistor M14 may be connected to the bias node $B_{COM}$. The second output node $N_{OUT2}$ may also serve as a second output terminal for a second output voltage $V_{OUTP}$.

The op-amp 200(3) may further comprise a dummy switch 1015 to improve the accuracy of an output of the op-amp 200(3). The dummy switch 1015 may comprise a transistor, such as an n-channel transistor. According to the present embodiment, the dummy switch 1015 is always set to OFF (open) for all operations.

The fourth sub-circuit 1035 may comprise a fourth plurality of transistors, such as a fifteenth transistor M15, a sixteenth transistor M16, and a seventeenth transistor M17. The fifteenth transistor M15 may comprise a p-channel transistor with a source terminal connected to the supply voltage VDD and a drain terminal connected to the sixteenth and seventeenth transistors M16, M17. A gate terminal of the fifteenth transistor M15 may be connected to a bias voltage.

The sixteenth and seventeenth transistors M16, M17 may be connected in parallel with each other and in series with the fifteenth transistor M15. The sixteenth and seventeenth transistors M16, M17 may comprise p-channel transistors.

Accordingly, source terminals of the sixteenth and seventeenth transistors M16, M17 may each be connected to the drain terminal of the fifteenth transistor M15. A gate terminal of the sixteenth transistor M16 may be connected to a common voltage $V_{COM}$ and a gate terminal of the seventeenth transistor M17 may be connected to a common mode feedback signal CMFB.

The fourth sub-circuit 1035 may further comprise an eighteenth transistor M18 and a nineteenth transistor M19 arranged as a current mirror and connected to the sixteenth and seventeenth transistors M16, M17. The eighteenth and nineteenth transistors M18, M19 may comprise n-channel transistors. Accordingly, a drain terminal of the eighteenth transistor M18 may be connected to a drain terminal of the sixteenth transistor M16 and a drain terminal of the nineteenth transistor M19 may be connected to the a drain terminal of the seventeenth transistor M17. The drain terminal of the nineteenth transistor M19 may also be connected to a gate terminal of the eighteenth transistor M18 and a gate terminal of the nineteenth transistor M19.

The second mode switch 1010 may comprise a transistor, such as an n-channel transistor. A drain terminal of the second mode switch 1010 may be connected to the fourth sub-circuit 1035, a source terminal of the second mode switch 1010 may be connected to the bias node $B_{COM}$, and a gate terminal of the second mode switch 1010 may be configured to receive the mode signal.

The sensor system 100 may further comprise a control circuit (not shown) configured to generate the mode signal ('H' and 'L') according to the desired mode operation. For example, the control circuit may generate the high mode signal ('H') to operate the op-amp 200 in the single-ended mode and may generate the low mode signal ('L') to operate the op-amp 200 in the fully-differential mode. The control circuit may comprise various logic gates and/or other circuitry suitable for generating a digital signal. The control circuit may be further configured to generate various switch signals (SW) to selectively operate the plurality of switches SW1A:SW12A and SW1B:SW12B (FIG. 2) through one or more signal paths.

The control circuit may comprise or operate in conjunction with an inverter 200. The inverter 265 may be configured to receive the mode signal at an input terminal and output a signal having an opposite logic-level. For example, when the inverter 265 receives a low mode signal 'L' (i.e., low voltage), it outputs a high mode signal (i.e., high voltage), and when the inverter 200 receives a high mode signal, it outputs a low mode signal. The inverter may comprise a logic gate, such as a NOT gate, for implementing logical negation. Alternatively, the inverter 265 may be integrated within the op-amp 200 or the amplifier circuit 110.

Figure 2:
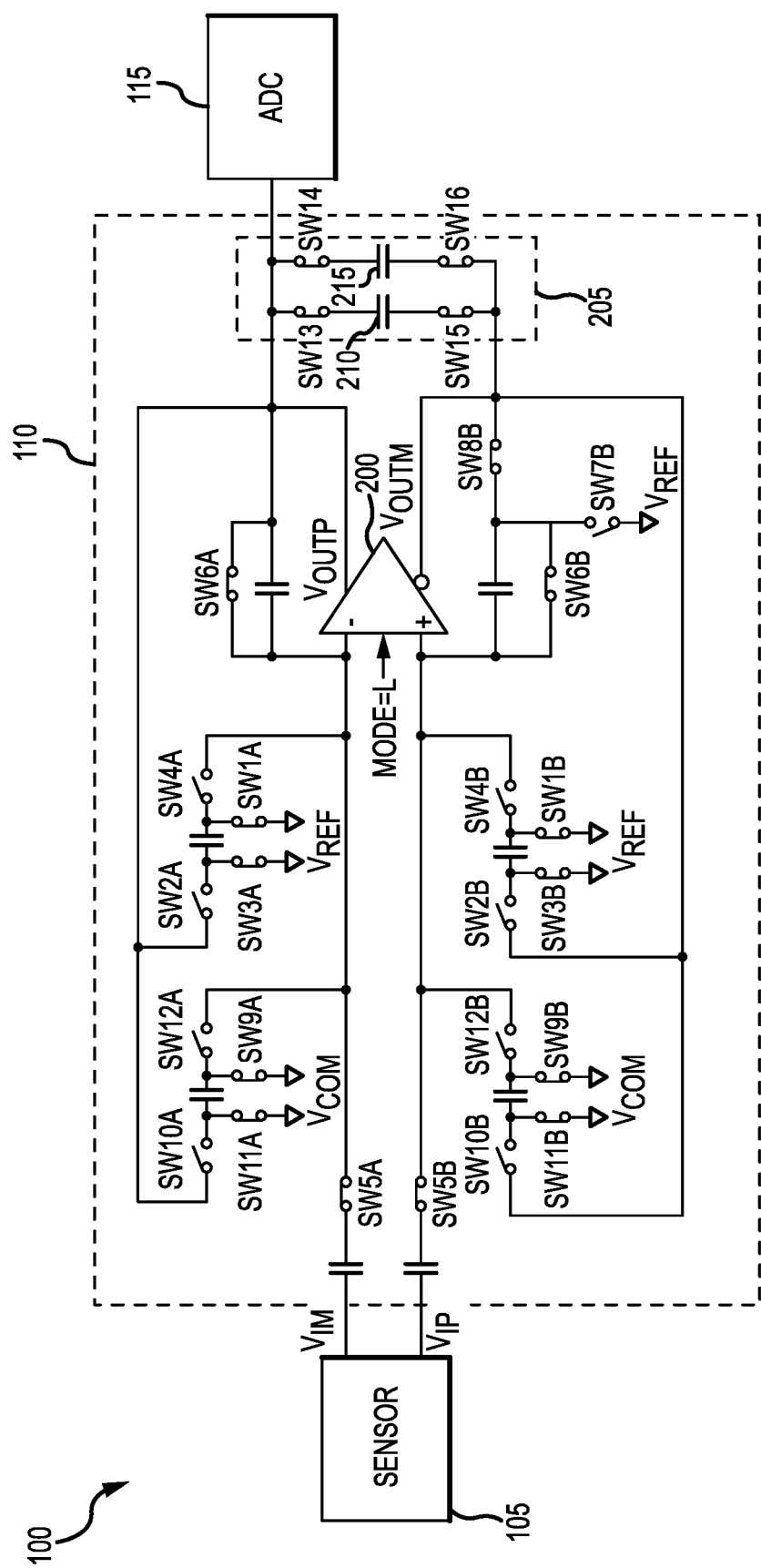
FIG. 2 is a circuit diagram of the multi-stage amplifier circuit during a first reset stage in accordance with an exemplary embodiment of the present technology.
Figure 3:
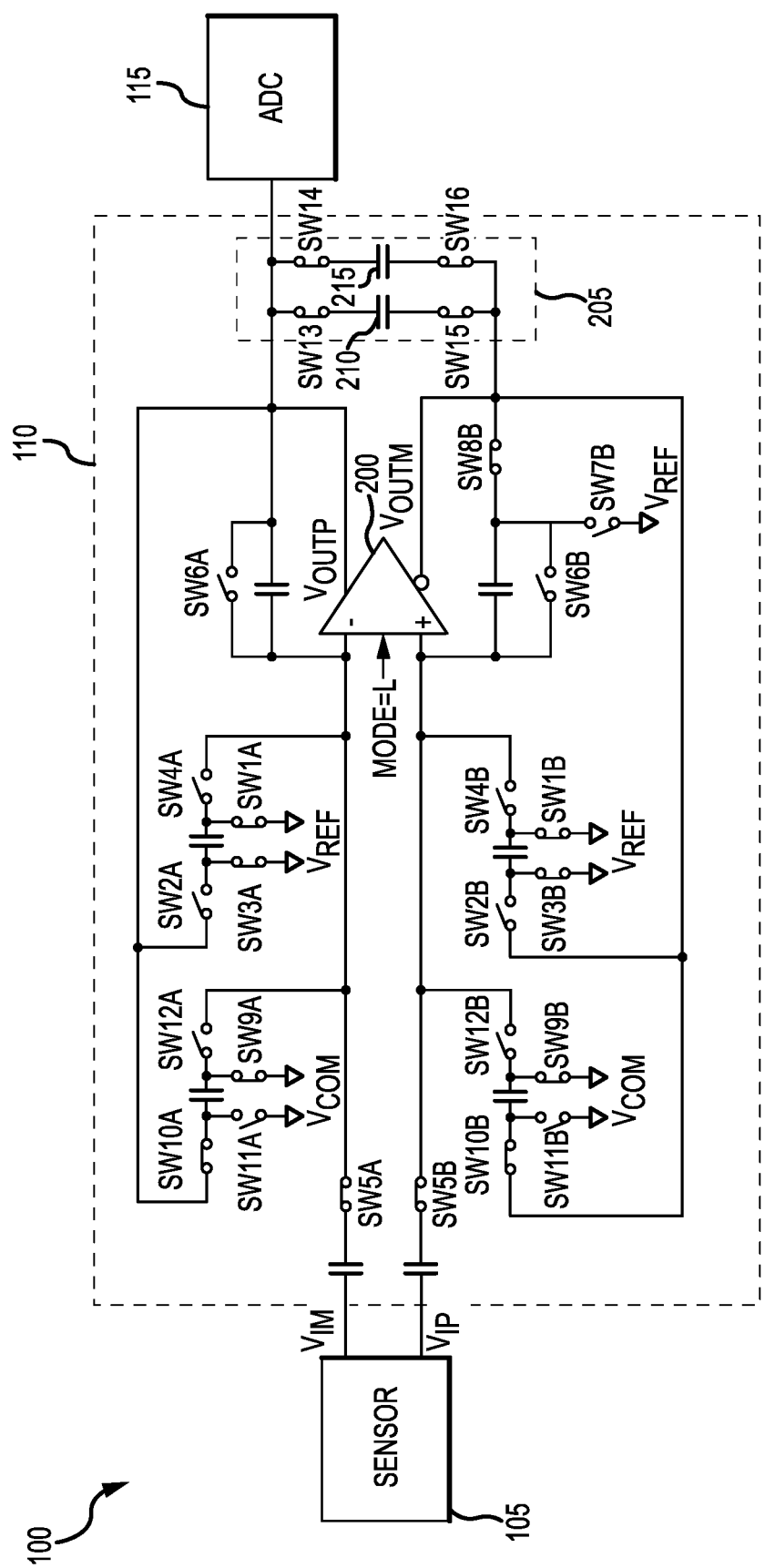
FIG. 3 is a circuit diagram of the multi-stage amplifier circuit during a first fully-differential operating stage in accordance with an exemplary embodiment of the present technology.
Figure 4:
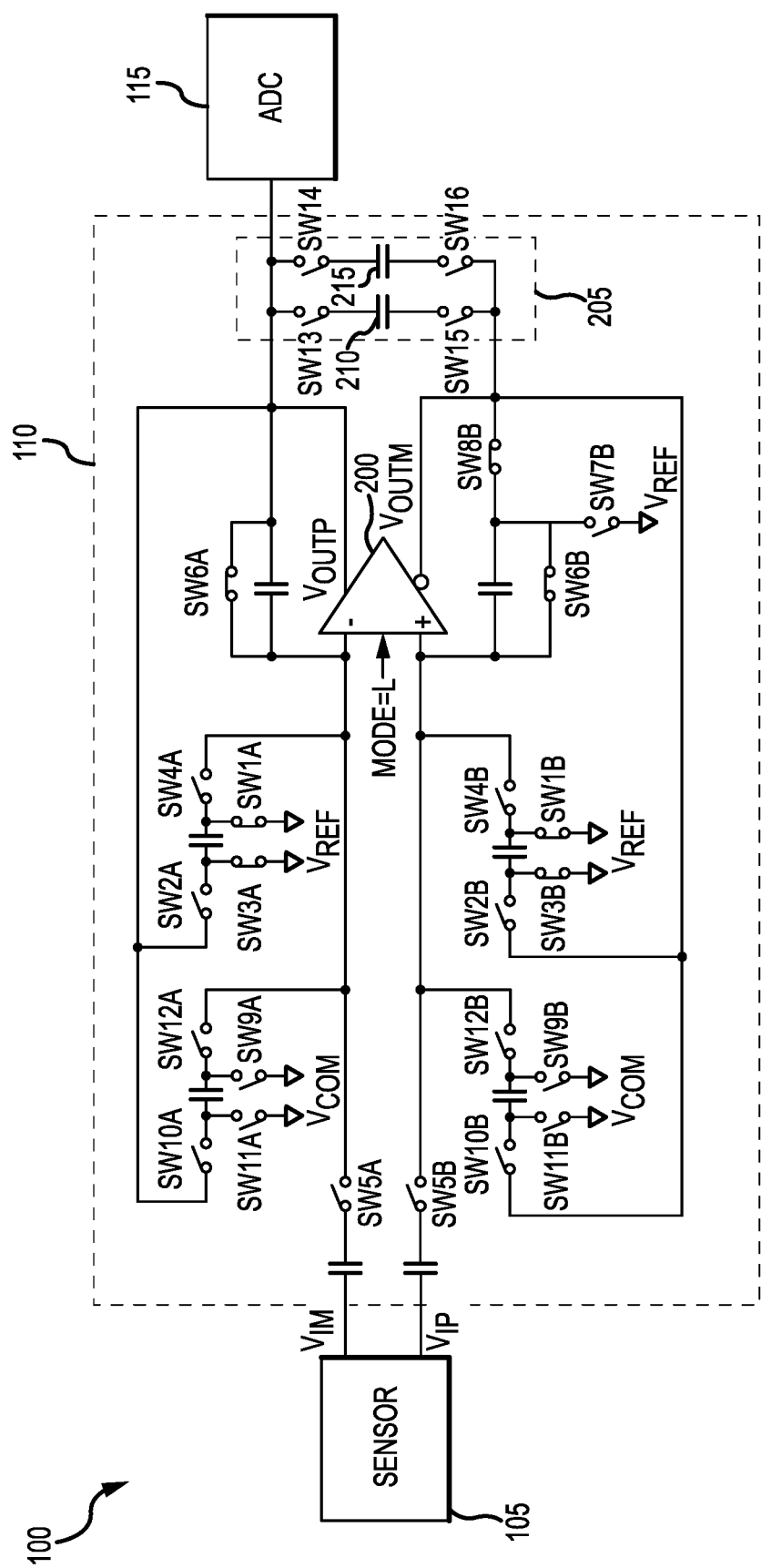
FIG. 4 is a circuit diagram of the multi-stage amplifier circuit during a second reset stage in accordance with an exemplary embodiment of the present technology.
Figure 5:
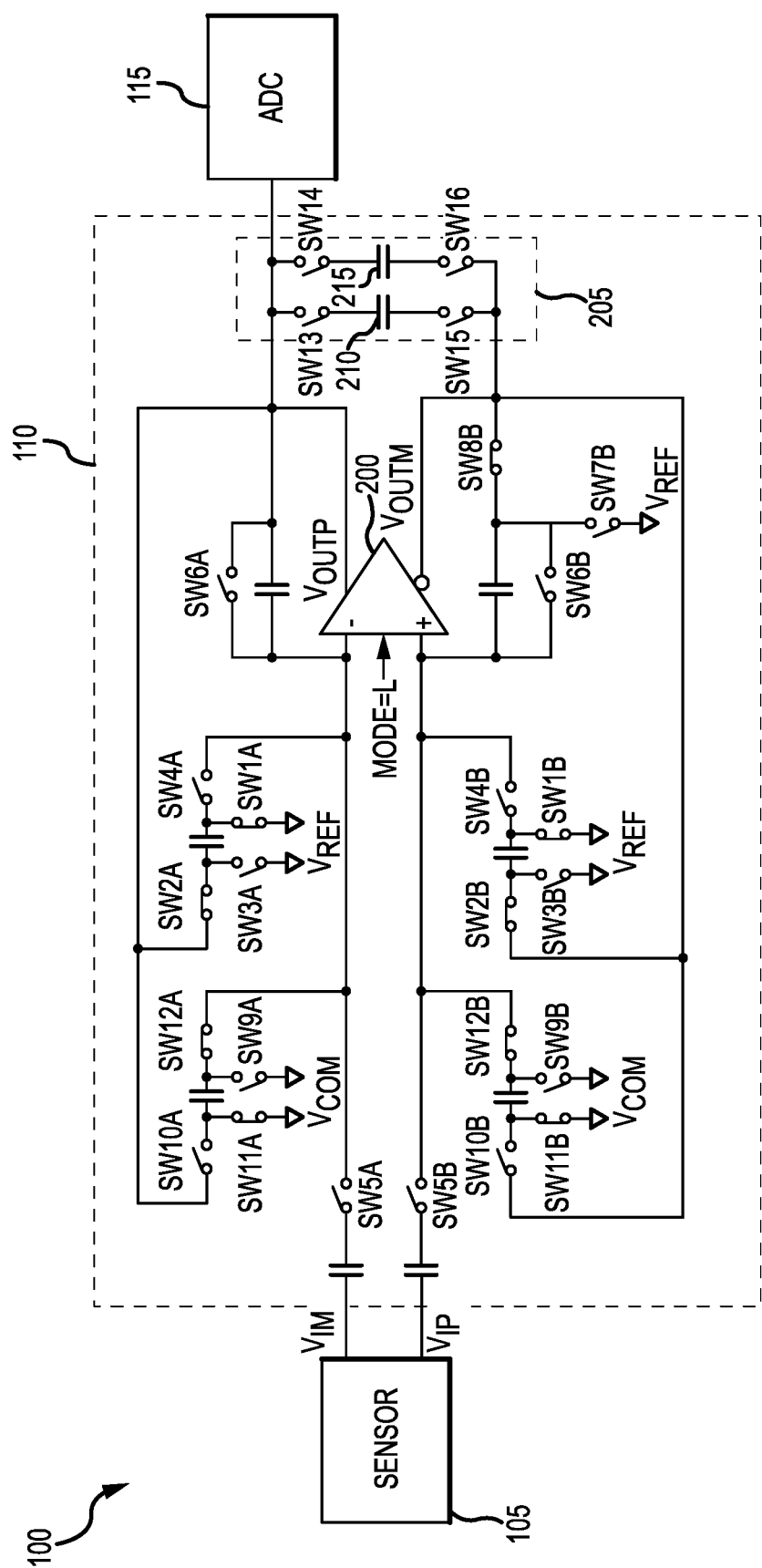
FIG. 5 is a circuit diagram of the multi-stage amplifier circuit during a second fully-differential operating stage in accordance with an exemplary embodiment of the present technology.
Figure 6:
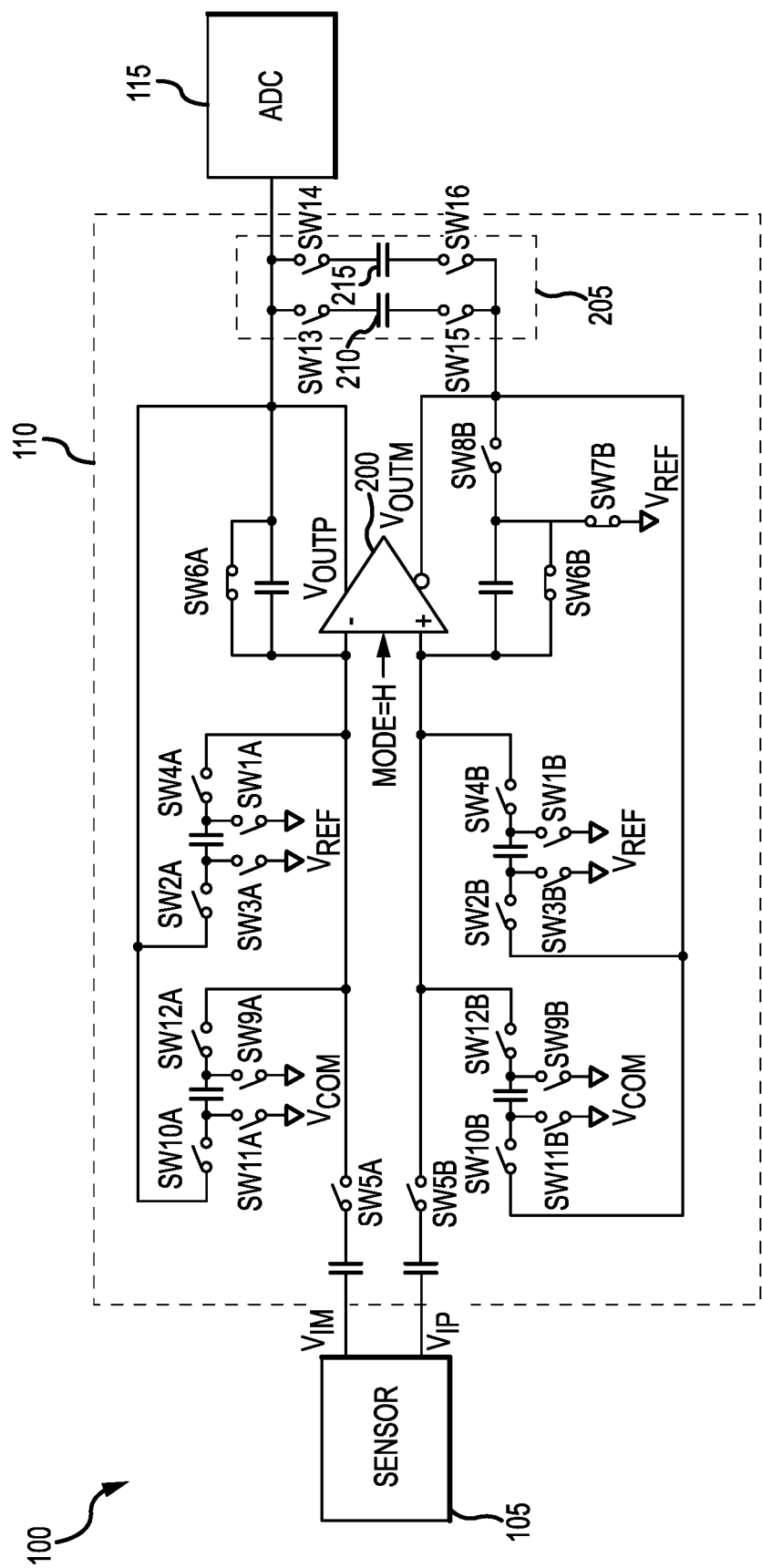
FIG. 6 is a circuit diagram of the multi-stage amplifier circuit during a third reset stage in accordance with an exemplary embodiment of the present technology.
Figure 7:
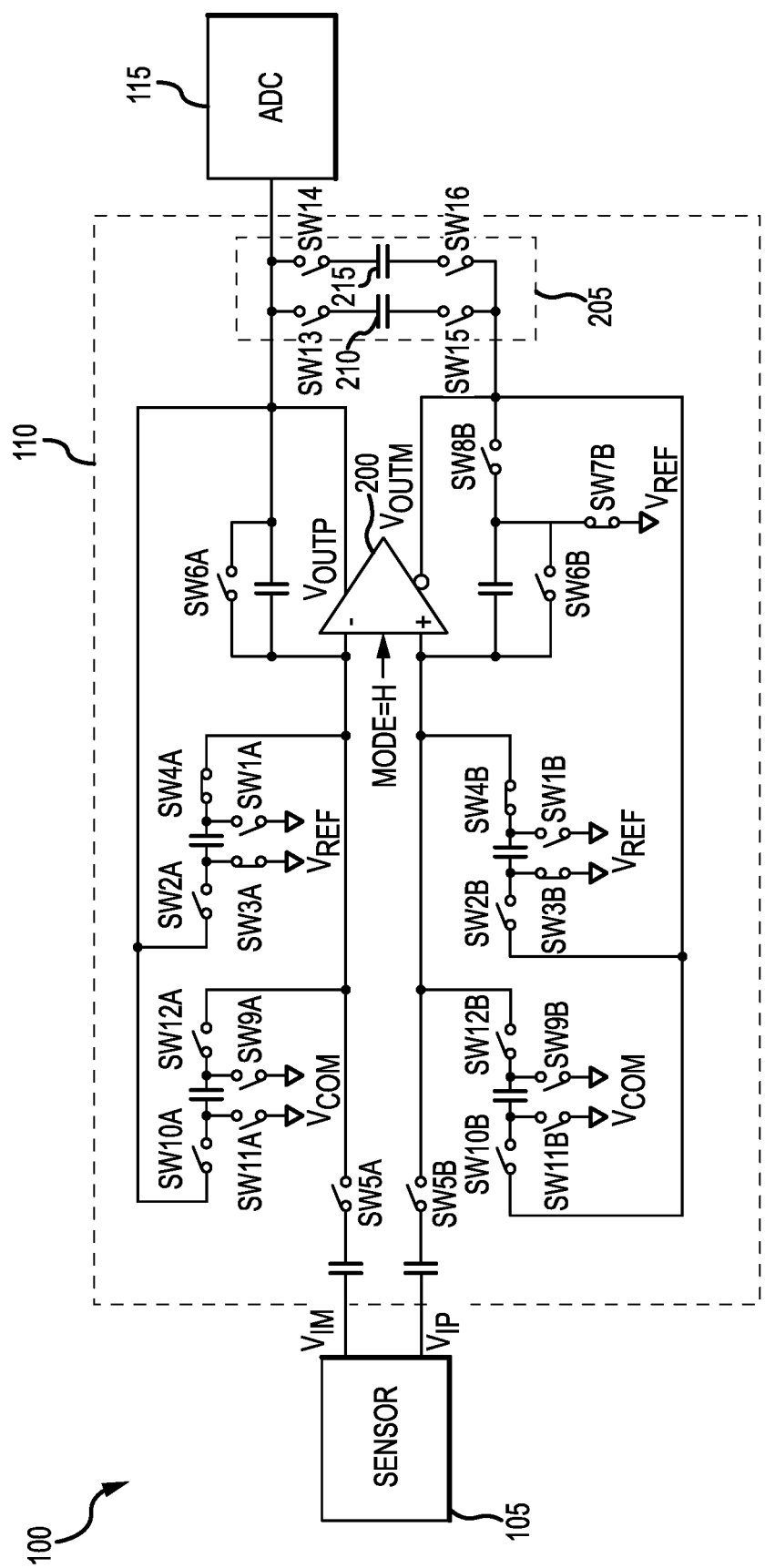
FIG. 7 is a circuit diagram of the multi-stage amplifier circuit during a single-ended operating stage in accordance with an exemplary embodiment of the present technology.
Figure 8:
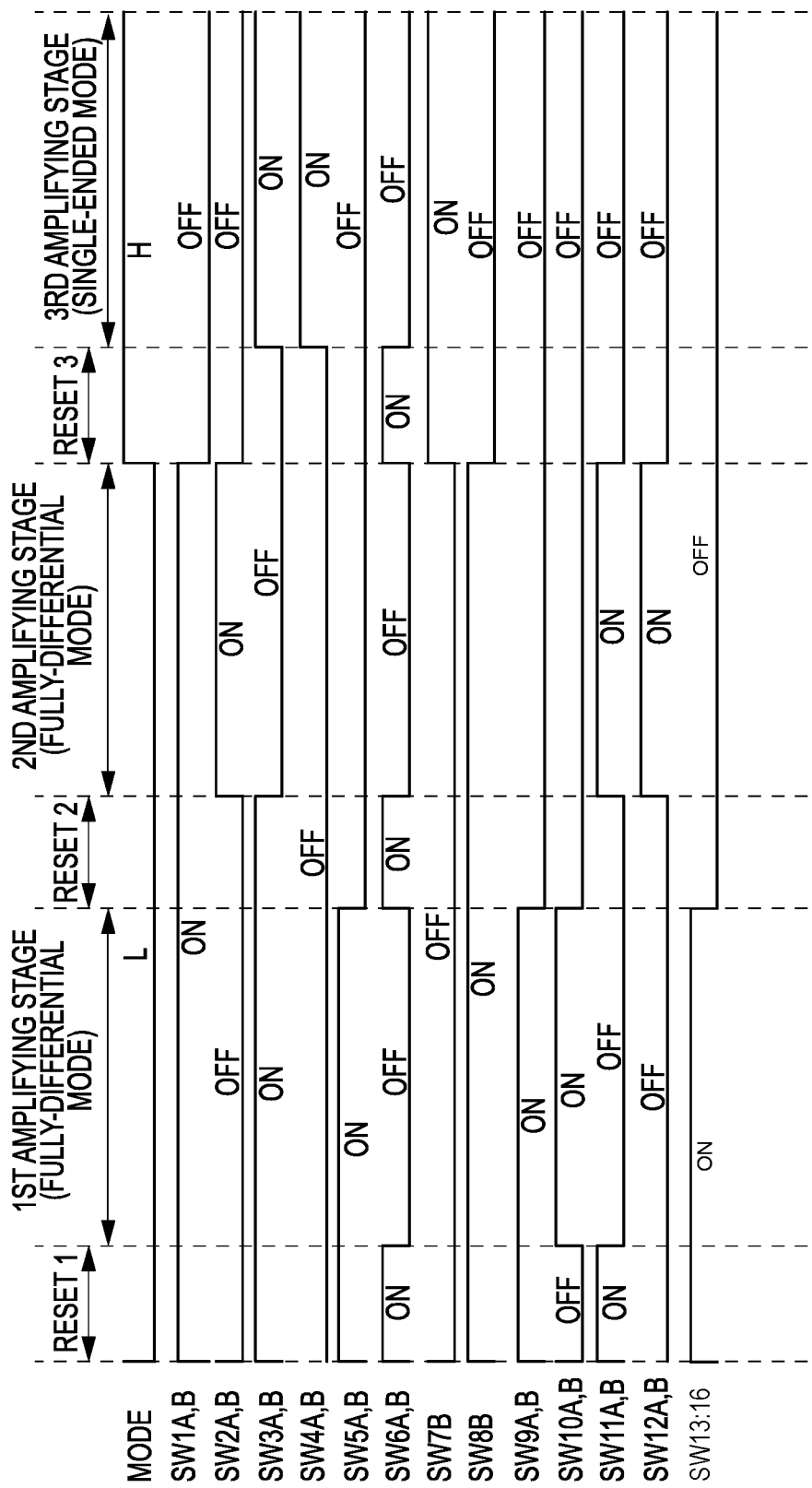
FIG. 8 is a timing diagram for operating the amplifier circuit in accordance with an exemplary embodiment of the present technology.
Figure 9:
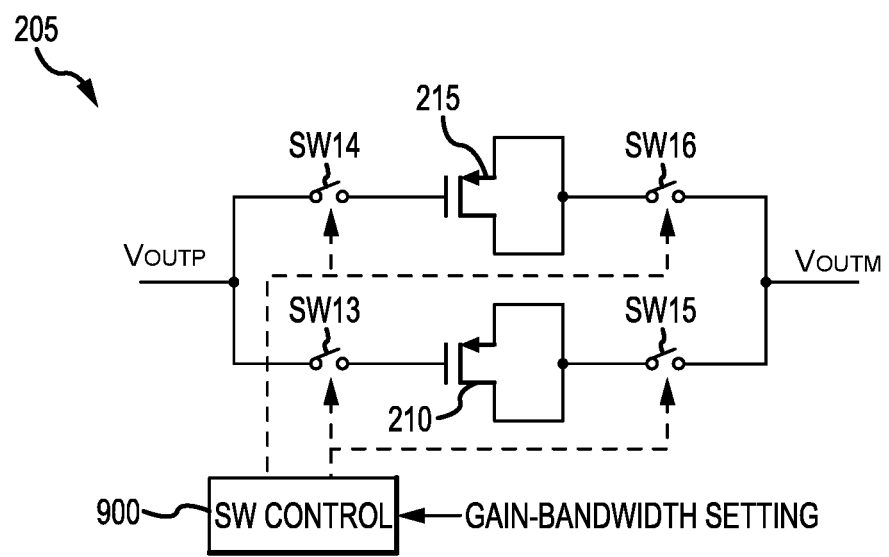
FIG. 9 is a circuit diagram for a switching circuit in accordance with the present technology.

Referring to FIGS. 2 and 9, the switching circuit 205 may be configured to selectively store charge and control a gain-bandwidth of the op-amp 200. For example, the switching circuit 205 may be configured to operate according to a gain-bandwidth setting.

According to an exemplary embodiment, the switching circuit 205 may comprise a first gain switch SW13 connected in series with a first charge storage device 210 (e.g., a capacitor or a transistor) and a second gain switch SW15 connected in series with the first charge storage device 210. The switching circuit 205 may further comprise a third gain switch SW14 connected in series with a second charge storage device 215 (e.g., a capacitor or a transistor) and a fourth gain switch SW16 connected in series with the second charge storage device 215. The series-connected circuits are connected in parallel with each other.

The switching circuit 205 may be further configured to have a variable capacitance. For example, the first and second charge storage devices 210, 215 may comprise a conventional capacitor with a variable capacitance or a MOS (metal-oxide-semiconductor) transistor having a gate capacitance. Due to their structure, MOS transistors have a parasitic capacitance that varies according to a voltage potential across the transistor. The parasitic capacitance may comprise gate-drain capacitance, a gate-source capacitance, and a drain-source capacitance, collectively referred to as the gate capacitance. Accordingly, the gate capacitance of the switching circuit 205 may vary based on the first and second output voltages $V_{OUTN}$, $V_{OUTP}$.

Figure 10:
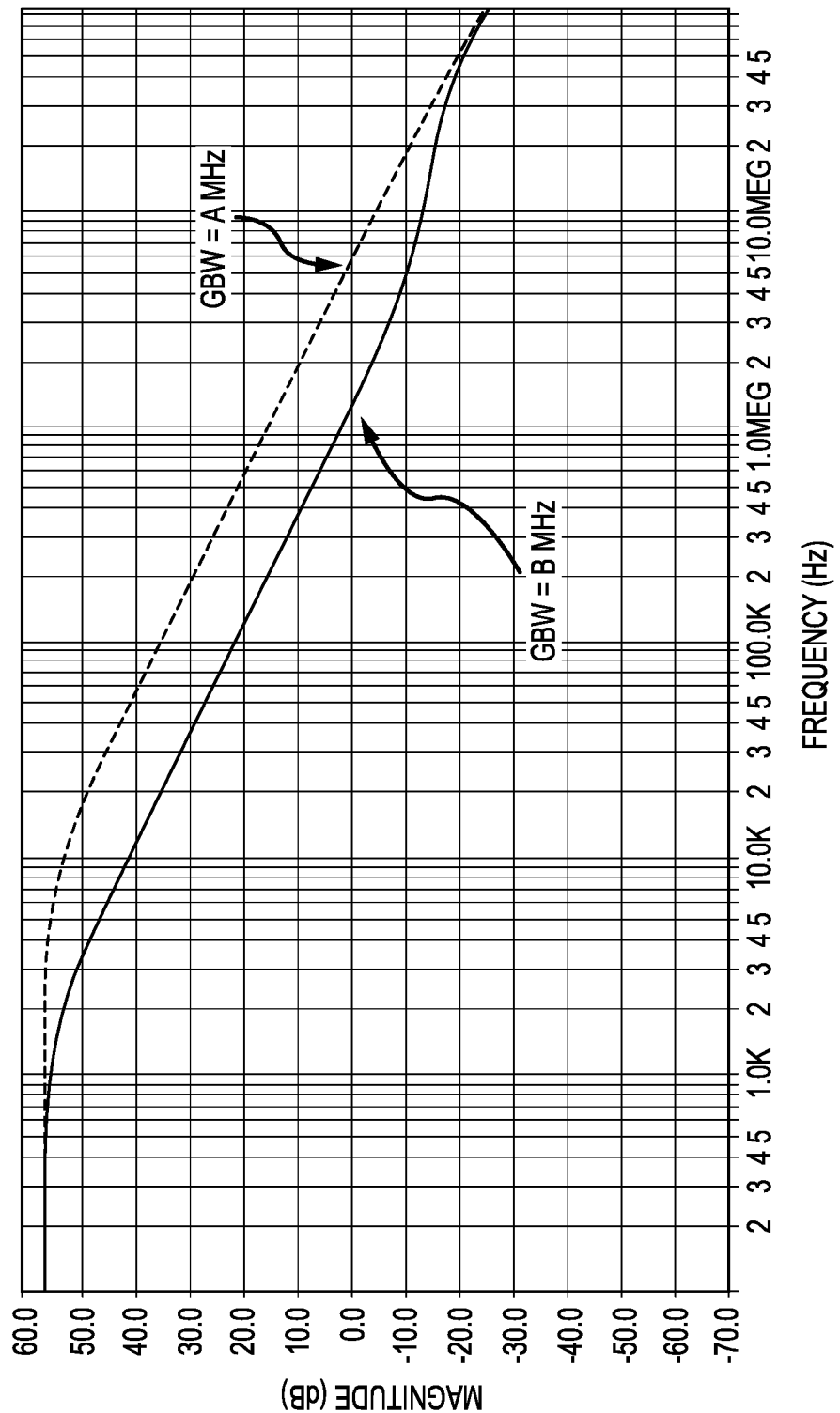
FIG. 10 illustrates various gain-bandwidths as a function of frequency in accordance with an exemplary embodiment of the present technology.

The capacitance of the switching circuit 205 may have an effect on the gain-bandwidth and thermal noise $V_N$ of the op-amp 200. For example, and referring to FIG. 10, when a capacitance of 6.0 pF (pico Farads) is provided by the switching circuit 205, the gain-bandwidth of the op-amp 200 is 1.2 MHz ($B_1$, gain-bandwidth at a higher capacitance). In contrast, when the capacitance of the switching circuit 205 is zero, the gain-bandwidth of the op-amp 200 is 5.7 MHz ($B_2$, gain-bandwidth at a lower capacitance). In general, the relationship between the gain-bandwidth and the thermal noise $V_N$ is described according to the following equation:

$V_N = \sqrt{4kTRB}$, where k is Boltzmann's constant, T is temperature, R is a resistance, and B is the gain-bandwidth. When the gain-bandwidth decreases, the thermal noise is described according to the following equation:

$$V_N = \sqrt{4kTR\left(\frac{B}{N}\right)} = \frac{\sqrt{4kTRB}}{\sqrt{N}},$$

where $N=B_2/B_1$.

Accordingly, a decrease in the gain-bandwidth results in a decrease to the thermal noise by a factor of $$\frac{1}{\sqrt{\frac{B_2}{B_1}}},$$

where $B_1$ is the gain-bandwidth at a higher capacitance and $B_2$ is the gain-bandwidth at a lower capacitance than $B_1$.

According to an exemplary embodiment, the switching circuit 205 is connected to the output terminals of the op-amp 200. For example, the first and third gain switches SW13, SW14 are directly connected to the second output terminal ($V_{OUTP}$) and the second and fourth gain switches SW15, SW16 are directly connected to the first output terminal ($V_{OUTN}$). The first and third gain switches SW13, SW14 are also directly connected to an input terminal of the ADC 115.

Each gain switch SW13:16 may operate according to a switch signal. For example, the system 100 may comprise a switch control circuit 900 to generate various switch signals that operate various switches in the system 100. The switch control circuit 900 may be responsive to the gain-bandwidth setting. In other words, the switch control circuit 900 generates the switch signals based on the gain-bandwidth setting. For example, when a high gain-bandwidth is desired, a first gain-bandwidth setting may be used and when a low gain-bandwidth is desired, a second gain-bandwidth setting may be used. When the high gain-bandwidth is desired, the gain-bandwidth setting may turn OFF (open) all the gain switches SW13:16. When the low gain-bandwidth is desired, the gain-bandwidth setting may turn ON (closed) all the gain switches SW13:16, or alternatively may turn OFF the first and second gain switches SW13, SW15 and turn ON the third and fourth gain switches SW14, SW16.

The ADC 115 may be configured to convert an analog signal into a digital signal. For example, the ADC 115 may be connected directly to the second output terminal of the op-amp 200.

According to an exemplary embodiment, it may be desired to increase or decrease the operating frequency of the op-amp 200. For example, it may be desired to operate the op-amp 200 at a low frequency. This may be achieved by increasing the capacitance of the op-amp 200 via the switching circuit 205, which has the effect of decreasing the gain-bandwidth of the op-amp 200. Accordingly, by selectively operating the gain switches SW13:16, the amplifier circuit 110 stores charge on the first and second charge storage devices 210,215 which slows down the op-amp 200, narrows the bandwidth reduces the thermal noise.

In contrast, it may be desired to operate the op-amp 200 at a high frequency. This may be achieved by decreasing the capacitance of the op-amp 200 via the switching circuit 205, which has the effect of increasing the gain-bandwidth of the op-amp 200. Accordingly, by selectively operating the gain switches SW13:16, no load is stored on the first and second charge storage devices 210, 215 and the bandwidth of the op-amp 200 increases, which speeds up the op-amp 200 operation.

In an exemplary operation, and referring to FIGS. 2-8 and 11, the amplifier circuit 110 may enter a first reset state (RESET 1). During the first reset state, switches SW1A,B, SW3A,B, SW5A,B, SW6A,B, SW8B, SW9A,B, and SW11A,B are ON; switches SW2A,B, SW4A,B, SW7, SW10A,B, and SW12A,B are OFF; the mode signal is set to low 'L', and the gain switches SW13:16 are ON to increase the capacitance and decrease the gain-bandwidth of the op-amp 200.

During a first amplifying stage, which immediately follows the first reset state, the op-amp 200 may operate in the fully-differential mode wherein switches SW1A,B remain ON, switches SW2A,B remain OFF, switches SW3A,B remain ON, switches SW4A,B remain OFF, switches SW5A,B remain ON, switches SW6A,B are turned OFF, switch SW7 remains OFF, switch SW8B remains ON, switches SW9A,B remain ON, switches SW10A,B are turned ON, switches SW11A,B are turned OFF, switches SW12A,B remain OFF, switches SW13:16 remain ON, and the mode signal remains low. Since capacitance is added, via the switching circuit 205 during the first amplifying stage, the operating frequency of the op-amp 200 slows down, which in turn, results in less thermal noise in the output signals of the op-amp 200.

During a second reset state (RESET 2), which immediately follows the first amplifying stage, the mode signal remains low, switches SW1A,B remain ON, switches SW2A,B remain OFF, switches SW3A,B remain ON, switches SW4A,B remain OFF, switches SW5A,B are turned OFF, switches SW6A,B are turned ON, switch SW7 remains OFF, switch SW8B remains ON, switches SW9A,B is turned OFF, switches SW10A,B are turned OFF, switches SW11A,B remain OFF, switches SW12A,B remain OFF, and the gain switches SW13:16 are turned OFF to disconnect the capacitance of the switching circuit 205 from the op-amp 200 and increase the gain-bandwidth of the op-amp 200.

During a second amplifying stage, which immediately follows the second reset state, the op-amp may operate in the fully-differential mode, wherein switches SW1A,B remain ON, switches SW2A,B are turned ON, switches SW3A,B are turned OFF, switches SW4A,B remain OFF, switches SW5A,B remain OFF, switches SW6A,B are turned OFF, switch SW7 remains OFF, switch SW8B remains ON, switches SW9A,B remain OFF, switches SW10A,B remain OFF, switches SW11A,B are turned ON, switches SW12A,B are turned ON, and switches SW13:16 remain OFF. Since no additional capacitance is added, via the switching circuit 205 during the second amplifying stage, the gain-bandwidth increases and the operating frequency of the op-amp 200 speeds up (increases).

During a third reset state (RESET 3), which immediately follows the second amplifying stage, the mode signal is set to high 'H', switches SW1A,B are turned OFF, switches SW2A,B are turned OFF, switches SW3A,B remain OFF, switches SW4A,B remain OFF, switches SW5A,B remain OFF, switches SW6A,B are turned ON, switch SW7B is turned ON, switch SW8B is turned OFF, switches SW9A,B remain OFF, switches SW10A,B remain OFF, switches SW11A,B are turned OFF, switches SW12A,B are turned OFF, and switches SW13:16 remain OFF.

During a third amplifying stage, which immediately follows the third reset state, the op-amp 200 may operate in the single-ended mode. The mode signal remains high, switches SW1A,B and SW2A,B remain OFF, switches SW3A,B are turned ON, switches SW4A,B are turned ON, switches SW5A,B remain OFF, switches SW6A,B are turned OFF, switch SW7B remains ON, and switch SW8B remains OFF.

During the fully-differential modes and when the mode signal is low ('L'), the first mode switch 245 receives a low signal, which turns the first mode switch 245 OFF, and the second mode switch 260 receives a high signal via the inverter 265, which turns the second mode switch ON.

During the single-ended mode and when the mode signal is high ('H'), the first mode switch 245 receive a high signal, which turns the first mode switch ON, and the second mode switch 260 receives a low signal via the inverter 265, which turns the second mode switch OFF.

It will be understood by those of ordinary skill in the art that the transistors may be implemented as either p-channel transistors or n-channel transistors. As such, the operation of the transistors may change accordingly. For example, the first and second mode switches 245, 260 may be implemented as p-channel transistors. In such a case, a high mode signal would turn the switch OFF and a low mode signal would turn the switch ON.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An amplifier circuit, comprising:
an operational-amplifier comprising:
    a first output terminal; and
    a second output terminal;
a switching circuit connected to the operational amplifier, and comprising:
    a first switch connected in series with a first charge storage device and directly connected to the first output terminal; and
    a second switch connected in series with the first charge storage device and the first switch, and directly connected to the second output terminal;
    wherein the first charge storage device is selectively connected to the first and second output terminals via the first and second switches; and
    wherein the switching circuit:
        is selectively operable to generate a variable capacitance; and
        controls a gain-bandwidth of the operational amplifier.

2. The amplifier circuit according to claim 1, wherein the first charge storage device comprises a transistor.

3. The amplifier circuit according to claim 1, wherein the switching circuit comprises:
    a first series-connected circuit comprising:
        the first switch connected in series with the first charge storage device; and
        the second switch connected in series with the first charge storage device; and
    a second series-connected circuit comprising:
        a third switch connected in series with a second charge storage device; and
        a fourth switch connected in series with the second charge storage device;
    wherein the first and second series-connected circuits are connected in parallel with each other.

4. The amplifier circuit according to claim 3, wherein:
    the first switch is also directly connected to the first output terminal;
    the second switch is also directly connected to the second output terminal;
    the third switch is also directly connected to the first output terminal; and
    the fourth switch is also directly connected to the second output terminal.

5. The amplifier circuit according to claim 1, wherein the operational amplifier is configured as a dual-mode operational amplifier capable of operating as a fully-differential amplifier and a single-ended amplifier.

6. The amplifier circuit according to claim 1, wherein the operational amplifier comprises:
    a first sub-circuit connected to a supply voltage and a bias node, and comprising:
        a first transistor connected in series with a second transistor;
        a third transistor connected in series with the second transistor; and
        a first node positioned between the second and third transistors;
    a first mode switch configured to selectively connect the first node to the bias node;
    a second sub-circuit connected to the first sub-circuit;
    a third sub-circuit connected to:
        the supply voltage; and
        the bias node;
    a fourth sub-circuit connected to the supply voltage; and
    a second mode switch configured to selectively connect the fourth sub-circuit to the bias node;
    wherein the operational amplifier operates in a fully-differential mode and a single-ended mode according to the first and second mode switches.

7. The amplifier circuit according to claim 6, wherein:
    the first mode switch is responsive to a first mode signal;
    the second mode switch is responsive to a second mode signal; and
    the second mode signal is the inverse of the first mode signal.

8. A method for controlling a gain-bandwidth of an operational amplifier, comprising:
    decreasing the gain-bandwidth comprising:
        selectively increasing a capacitance at a first output terminal and a second output terminal of the operational amplifier comprising disconnecting a charge storage device from the first and second output terminals of the operational amplifier with a first switch and a second switch; and increasing the gain-bandwidth comprising:
selectively decreasing the capacitance at the first and second output terminals of the operational amplifier comprising connecting the charge storage device to the first and second output terminals of the operational amplifier;

wherein:
the first switch is connected in series with the charge storage device and directly connected to the first output terminal; and
a second switch is connected in series with the charge storage device and the first switch, and directly connected to the second output terminal.

9. A system, comprising:
a sensor; and
an amplifier circuit connected to the sensor and comprising:
a dual-mode operational-amplifier configured to operate in a fully-differential mode and a single-ended mode according to a mode signal, comprising:
a first output terminal; and
a second output terminal; and
a switching circuit selectively connected to the operational amplifier and configured to control a gain-bandwidth of the operational amplifier.

10. The system according to claim 9, wherein the switching circuit comprises:
a first switch connected:
directly to the first output terminal; and
in series with a transistor; and
a second switch connected:
directly to the second output terminal; and
in series with the transistor and the first switch.

11. The system according to claim 9, wherein the switching circuit comprises:
a first series-connected circuit comprising:
a first switch connected in series with a first charge storage device; and
a second switch connected in series with the first charge storage device;

a second series-connected circuit comprising:
a third switch connected in series with a second charge storage device; and
a fourth switch connected in series with the second charge storage device;
wherein the first and second series-connected circuits are connected in parallel with each other.

12. The system according to claim 9, wherein the dual-mode operational-amplifier comprises: a first sub-circuit connected to a supply voltage and a bias node, and comprising:
a first transistor connected in series with a second transistor;
a third transistor connected in series with the second transistor; and
a first node positioned between the second and third transistors;
a first mode switch configured to selectively connect the first node to the bias node;
a second sub-circuit connected to the first sub-circuit;
a third sub-circuit connected to:
the supply voltage; and
the bias node;
a fourth sub-circuit connected to the supply voltage; and
a second mode switch configured to selectively connect the fourth sub-circuit to the bias node;
wherein the operational amplifier operates in a fully-differential mode and a single-ended mode according to the first and second mode switches.

13. The system according to claim 9, wherein the switching circuit is selectively operable to generate a variable capacitance.

14. The system according claim 9, wherein the switching circuit is selectively connected to the first and second output terminals of the operational amplifier.

15. The system according to claim 11, wherein the first charge storage device comprises a transistor.

16. The method according to claim 8, wherein the charge storage device comprises a transistor.

* * * * *